(12) United States Patent
Murphy

(10) Patent No.: US 8,739,396 B2
(45) Date of Patent: Jun. 3, 2014

(54) TECHNIQUE FOR LIMITING TRANSMISSION OF FAULT CURRENT

(75) Inventor: Paul J. Murphy, Reading, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 13/161,068

(22) Filed: Jun. 15, 2011

(65) Prior Publication Data

US 2011/0308078 A1    Dec. 22, 2011

Related U.S. Application Data

(60) Provisional application No. 61/355,890, filed on Jun. 17, 2010.

(51) Int. Cl.
    *H01R 43/00* (2006.01)

(52) U.S. Cl.
    USPC ........... 29/825; 29/592.1; 29/599; 361/19; 361/35; 361/38; 361/40; 361/41; 361/93.9; 361/100; 361/101; 361/102; 361/141; 257/E39.001; 505/850; 505/851; 505/856; 505/866; 505/881; 438/2

(58) Field of Classification Search
    USPC ........... 29/622, 846, 881, 599, 825, 592.1; 438/2; 505/850, 851, 856, 866, 881, 505/883, 887; 257/E39.001; 361/19, 35, 38, 361/40, 41, 93.9, 100, 101, 102, 141
    See application file for complete search history.

(56) References Cited

U.S. PATENT DOCUMENTS

| | | | | |
|---|---|---|---|---|
| 4,184,186 A | * | 1/1980 | Barkan | 361/10 |
| 5,225,956 A | * | 7/1993 | Hara et al. | 361/19 |
| 5,436,606 A | * | 7/1995 | Cottevieille et al. | 335/216 |
| 5,446,365 A | * | 8/1995 | Nomura et al. | 320/128 |
| 5,514,915 A | * | 5/1996 | Kim et al. | 307/64 |
| 5,561,579 A | * | 10/1996 | Gyugyi et al. | 361/100 |
| 5,600,522 A | * | 2/1997 | Hull | 361/19 |
| 5,617,280 A | * | 4/1997 | Hara et al. | 361/19 |
| 5,650,901 A | * | 7/1997 | Yamamoto | 361/8 |
| 5,694,279 A | * | 12/1997 | Mumford | 361/19 |
| 5,812,353 A | * | 9/1998 | Albert et al. | 361/58 |
| 5,986,536 A | * | 11/1999 | Ries et al. | 338/13 |
| 6,016,094 A | * | 1/2000 | Gerhold | 335/216 |
| 6,199,264 B1 | * | 3/2001 | Marcou et al. | 29/593 |

(Continued)

FOREIGN PATENT DOCUMENTS

| | | | | |
|---|---|---|---|---|
| JP | 61220014 A | * | 9/1986 | G05F 1/613 |
| WO | 9827635 A1 | | 6/1998 | |

OTHER PUBLICATIONS

Mathias Noe and Michael Steurer—Superconductor. Sci. Technol. vol. 20 No. 3—Jan. 15, 2007.*

*Primary Examiner* — Peter DungBa Vo
*Assistant Examiner* — Azm Parvez

(57) ABSTRACT

Several embodiments of a novel technique for limiting transmission of fault current are disclosed. Current power distribution systems typically have an impedance, or reactor, on the output of the network equipment to limit current in the case of a fault condition. A low resistance switch, which changes its resistance in the presence of high current, is connected in parallel with this reactor. Thus, in normal operation, the current from the power generator bypasses the reactor, thereby minimizing power loss. However, in the presence of a fault, the resistance of the switch increases, forcing the current to pass through the reactor, thereby limiting the fault current.

10 Claims, 5 Drawing Sheets

(56) References Cited

U.S. PATENT DOCUMENTS

| | | | |
|---|---|---|---|
| 6,650,518 B2 * | 11/2003 | Kuperman et al. | 361/54 |
| 6,654,222 B2 * | 11/2003 | Jungst et al. | 361/93.9 |
| 7,283,339 B2 * | 10/2007 | Tekletsadik | 361/19 |
| 7,327,542 B2 * | 2/2008 | Juengst et al. | 361/58 |
| 7,545,611 B2 * | 6/2009 | Lee et al. | 361/19 |
| 7,551,410 B2 * | 6/2009 | Darmann | 361/19 |
| 7,724,482 B2 * | 5/2010 | Folts et al. | 361/19 |
| 7,742,264 B2 * | 6/2010 | Hyun et al. | 361/19 |
| 8,532,725 B2 * | 9/2013 | Folts et al. | 505/230 |
| 2005/0153843 A1 * | 7/2005 | Kubota | 505/100 |
| 2007/0139832 A1 | 6/2007 | Lee et al. | |
| 2008/0043382 A1 * | 2/2008 | Lee et al. | 361/19 |
| 2010/0051437 A1 * | 3/2010 | Kruska et al. | 200/502 |
| 2010/0149707 A1 * | 6/2010 | Folts et al. | 361/58 |
| 2010/0182813 A1 * | 7/2010 | Asano et al. | 363/126 |
| 2010/0296208 A1 * | 11/2010 | Tekletsadik et al. | 361/43 |
| 2011/0177953 A1 * | 7/2011 | Llambes et al. | 505/150 |
| 2011/0312498 A1 * | 12/2011 | Tekletsadik | 505/150 |
| 2012/0154959 A1 * | 6/2012 | Fish | 361/19 |

* cited by examiner

TECHNIQUE FOR LIMITING TRANSMISSION OF FAULT CURRENT

PRIORITY

This application is a non-provisional application of and claims priority to U.S. Provisional Patent Application Ser. No. 61/355,890, filed Jun. 17, 2010. The entire specification of U.S. Provisional Patent Application Ser. No. 61/355,890 is incorporated herein by reference.

FIELD

The present application relates to a technique for limiting transmission of fault current.

BACKGROUND

In electric power transmission and distribution networks, fault current conditions may occur. A fault current condition is an abrupt surge in the current flowing through the network caused by faults or short circuits in the network. Causes of the faults may include lightning striking the network, and downing and grounding of the transmission power lines due to severe weather or falling trees. When faults occur, load appears to be reduced instantaneously. The network, in response, delivers a large amount of current (i.e. overcurrent) to this load or, in this case, the faults. This surge or fault current condition is undesirable as the condition may damage the network or equipment connected to the network. In particular, the network and the equipment connected thereto may burn or, in some cases, explode.

One of the systems used to protect power equipments from damages caused by fault currents may be a current limiting reactor. Referring to FIG. 1, there is shown a portion of the power transmission and distribution network 100. As illustrated in the figure, the network 100 may comprise a network equipment 102. Herein, the network equipment 102 may be a transformer, a power generator, and/or any other component that may be connected into the network 100. To reduce or prevent the fault current from flowing into and damaging the equipment 102, a current limiting reactor 104 may be serially connected to the network equipment 102. In some embodiments, the network equipment 102 may be a power source and the current limiting reactor 104 may be disposed downstream of the network equipment 102. In other embodiments, the network equipment may be a power sink and the current limiting reactor 104 may be disposed upstream of the network equipment 102. As the name implies, the current limiting reactor 104 may have high resistance or impedance, or both, to limit the amount of current flowing into or out of the network equipment 102 during the fault condition.

Although connecting the current limiting reactor 104 to the network equipment 102 may protect the equipment 102 during the fault condition, the reactor 104 has many disadvantages. Among others, the current limiting reactor 104 may also limit the amount of voltage available to the network equipment 102 during the normal operation. If the power network is a constant voltage network, this voltage loss must be compensated for through the use of capacitors, dynamic volt ampere reactive (VAR) compensators, or other means. These systems also can change the phase angle of the power, causing difficulty in transmitting real power to the end user. As such, great amounts of power are lost during normal operation. For example, as much as 3% of the power is lost due to the reactor 104. To compensate for this loss, additional current or power must be generated. Generating additional current or power may place undue financial burden on the power generator and/or power distributor and, ultimately to the power consumer.

As such, a new technique for limiting transmission of fault current is needed.

SUMMARY

Several embodiments of a novel technique for limiting transmission of fault current are disclosed. Current power distribution systems typically have an impedance, or reactor, on the output of the network equipment to limit current in the case of a fault condition. A low resistance switch, which changes its resistance in the presence of high current, is connected in parallel with this reactor. Thus, in normal operation, the current from the power generator bypasses the reactor, thereby minimizing power loss. However, in the presence of a fault, the resistance of the switch increases, forcing the current to pass through the reactor, thereby limiting the fault current.

BRIEF DESCRIPTION OF THE DRAWINGS

For a better understanding of the present disclosure, reference is made to the accompanying drawings, which are incorporated herein by reference and in which.

DETAILED DESCRIPTION

Figure 1:
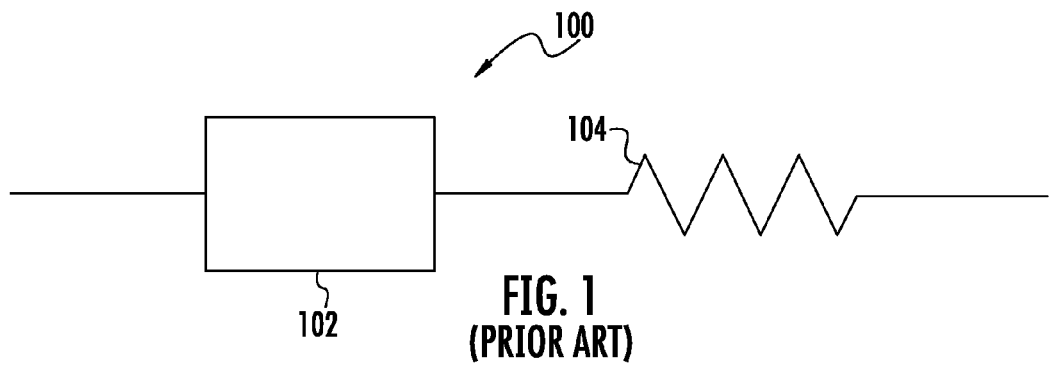
FIG. 1 is an example of a power transmission and distribution system.
Figure 2:
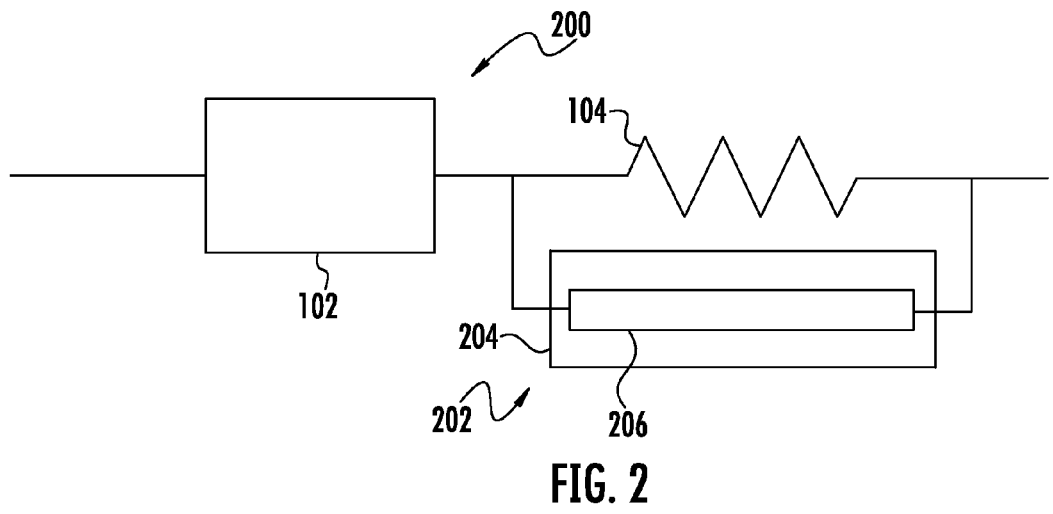
FIG. 2 is an embodiment of a fault current limiting system.

In the present disclosure, several embodiments of a novel technique for limiting transmission of fault current are introduced. Referring to FIG. 2, there is shown a portion of a power transmission or distribution network 200 according to one embodiment of the present disclosure. As shown in the figure, the power transmission or distribution network 200 may comprise, among others, a network equipment 102 connected in the network 200. In the network 200, there may also be a current limiting reactor 104 serially connected to the network equipment 102. Further, there may be a current limiting switch 202 connected to the current limiting reactor 104 in a parallel connection.

In the present embodiment, the current limiting switch 202 may be a fault current limiter. The current limiting switch 202 of the present embodiment may comprise an enclosure 204 and a circuit 206 connected to the reactor 104 in a parallel connection. In the present embodiment, the circuit 206 may preferably be a superconducting circuit. However, the present disclosure does not preclude the circuit 206 made out of other types of electrical conductor. For example, circuits comprising other conducting or semiconducting materials may be included. The inclusion of any circuit 206 in parallel with the reactor 104 will necessarily lower the overall impedance. However, it may be preferable that the circuit 206 has resistance or impedance less than the resistance or impedance of the reactor 104.

To manufacture the network 200 of the present embodiment, the current limiting switch 202 may be connected to the existing network 100 such that the current limiting switch 202 is in parallel connection to the reactor 104. By providing the current limiting switch 202 to the existing network 100, the components in the network such as, for example, the network equipment 102 need not be taken down, and the operation of the network equipment 102 need not be interrupted.

During normal operation, current may flow into or out of the network equipment 102. If the current limiting switch 202 includes a superconducting circuit 206 that is connected to the reactor 104 in a parallel connection, the resistance or impedance of the reactor 104 and the current limiting switch 202, taken together, may be negligible. In effect, the current flowing into or out of the network equipment 102 may bypass the reactor 104. Even if a circuit other than the superconducting circuit is included in the current limiting switch 202, the resistance or impedance experienced by the current flowing into or out of the network equipment 102 will be less than the resistance or impedance without the current limiting switch 202 with parallel connection.

Figure 5:
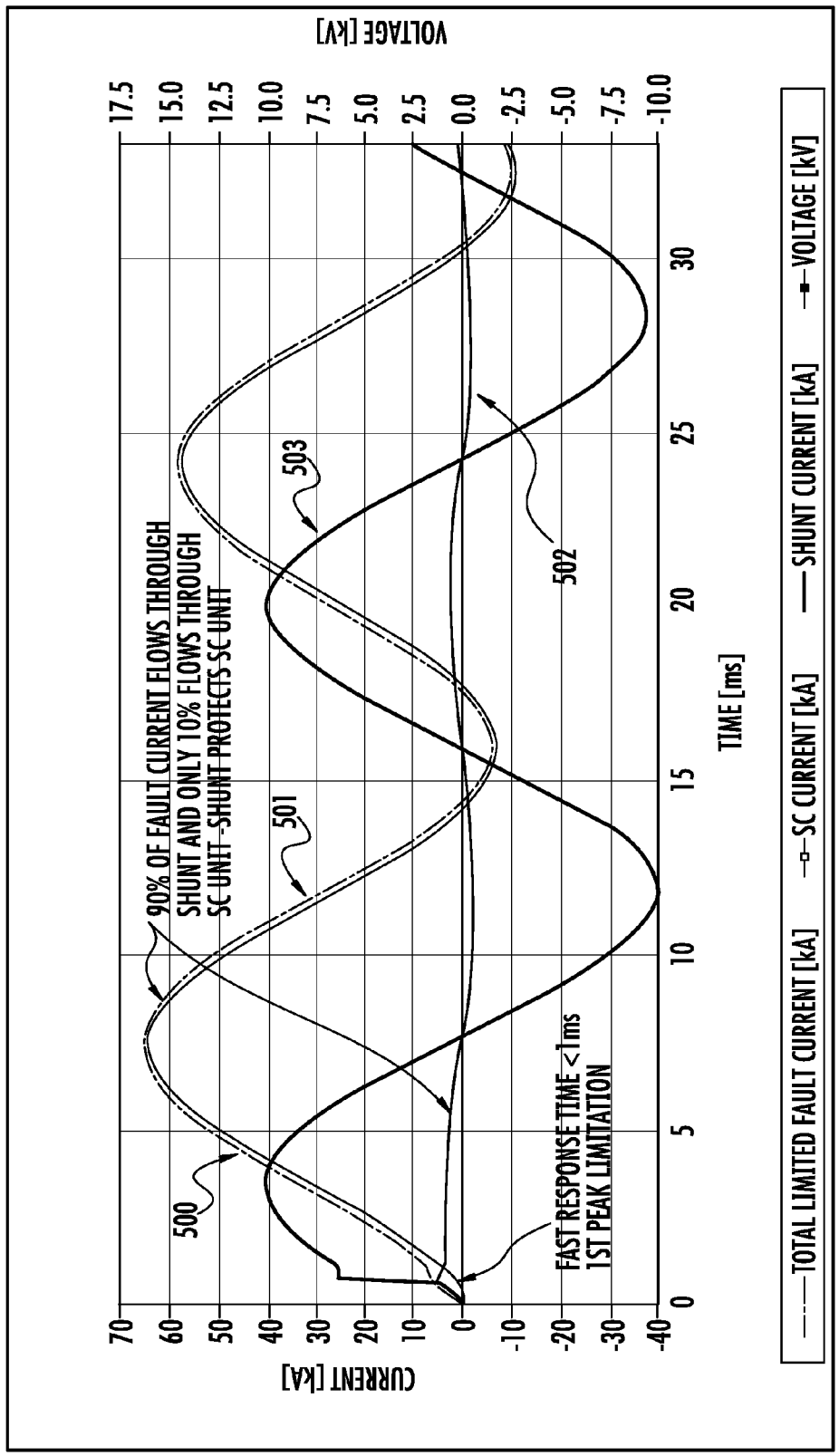
FIG. 5 illustrates the operation of the fault current limiting system.

During the fault condition, the superconducting circuit 206 may be quenched and its resistance or impedance may surge. In the process, the fault current flowing into or out of the network equipment 102 may be limited by the reactor 104 and the current limiting switch 202. For example, if the resistance or impedance of the circuit 206 increases significantly, the overall impedance of the parallel circuit may approach that of the reactor 104. FIG. 5 shows a graph of various parameters of a power network during a fault. Line 500 is the total limited fault current; line 501 represents the current through the reactor 104; line 502 represents the current through the current limiting switch 202 and line 503 represents the voltage output from the network equipment 102. At time 0, a fault is created. At that time, the voltage output 503 drops to zero. However, in a short time, such as less than 1 millisecond, the current limiting switch 202 opens, thereby increasing its impedance dramatically. This reduces the current flowing through the current limiting switch 202, as shown by line 502. This also causes the bulk of the current to flow through the reactor 104, as shown by line 501. This restores the voltage output of the network equipment 102, as a larger impedance is now present. As such, the network equipment 102 may be protected during the fault condition. Meanwhile, changes to power transmission characteristics, such as power loss, voltage loss and compensation, and phase angle change, may be minimized during normal operation.

One consideration of the current limiting switch 202 is its response time. In FIG. 5, the current limiting switch 202 responds to the fault in less than 1 millisecond. The power being distributed has a frequency and a period. In some embodiments, the current limiting switch 202 is designed to change its impedance within ¼ period of the power output of the network equipment 102. This guarantees that the current limiting switch 202 is turned off and current is passing through the reactor 104 before it reaches its first peak. For a 60 Hz signal, this requires that the current limiting switch 202 operate in less than 4 milliseconds. For other frequencies, different switching times may be required.

Figure 3A:
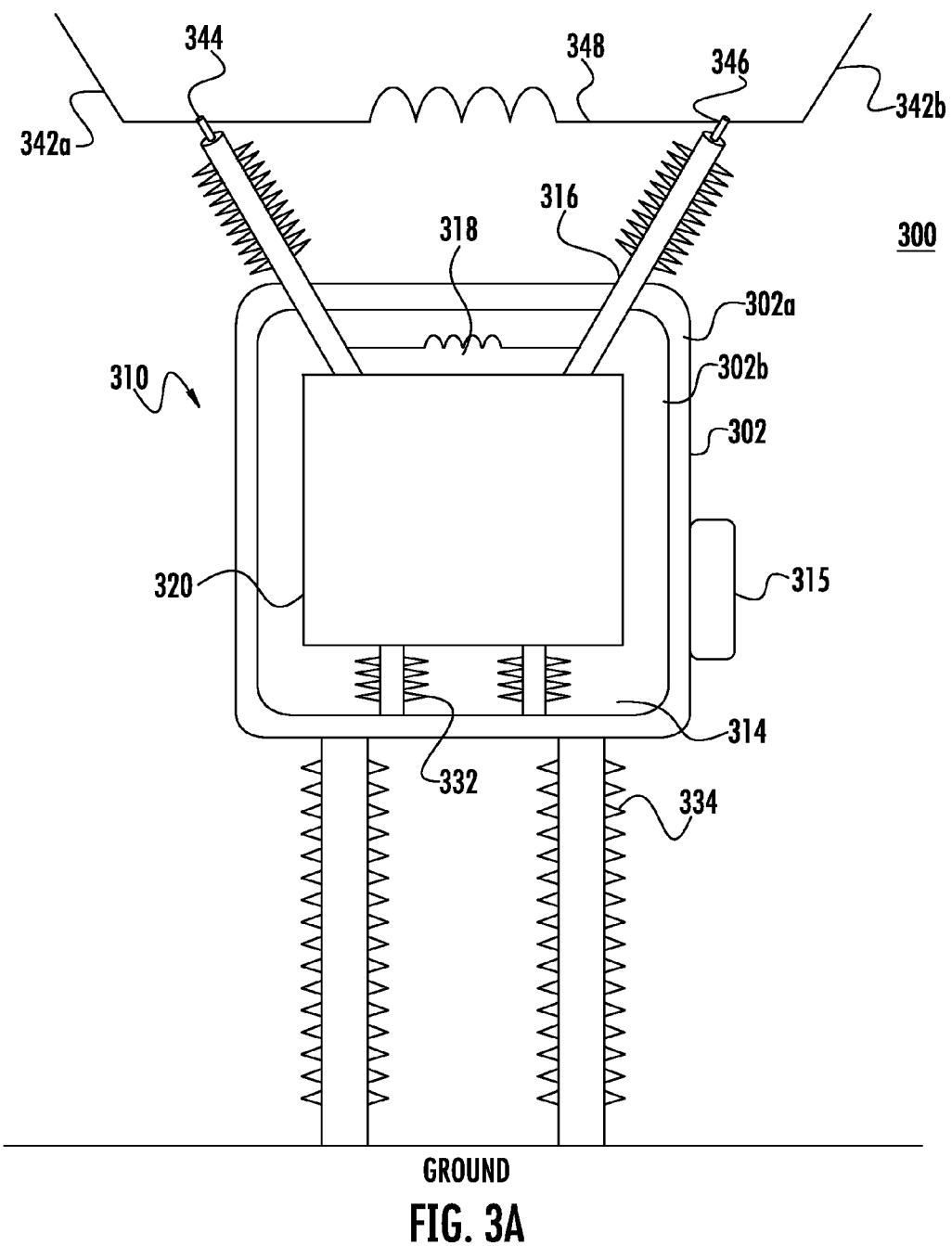
FIGS. 3A-B are an exemplary fault current limiter for use with one embodiment.
Figure 3B:
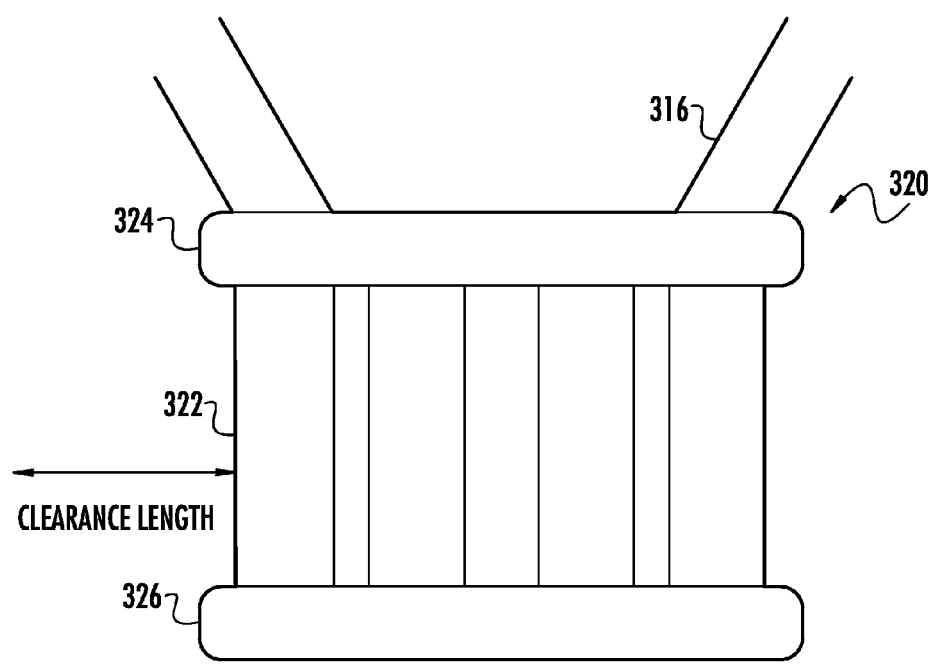

Referring to FIGS. 3A and 3B, there are shown an exemplary fault current limiter or fault current limiting system 300 according to one embodiment of the present disclosure. This fault current limiting system 300 may serve as the current limiting switch 202 shown in FIG. 2. In the present disclosure, the system 300 is a superconducting fault current limiting (SCFCL) system 300. The SCFCL system 300 may comprise an enclosure or tank 302 defining a chamber therein, which corresponds to enclosure 204 shown in FIG. 2. In one embodiment, the enclosure or tank 302 may be a thermally and/or electrically insulating tank 302 such as those made with fiberglass or other dielectric material. In another embodiment, the tank 302 is a metallic tank 302 comprising inner and outer layers 302a and 302b, and a thermally and/or electrically insulating medium interposed therebetween.

Within the tank 302, there may be one or more fault current limiting units 320 which, for the purpose of clarity and simplicity, are shown as a block. As illustrated in FIG. 3B, one or more superconducting circuits 322 and first and second end caps 324 and 326 may be disposed in the fault current limiting units 320. The first and second end caps 324 and 326, in one embodiment, may be corona shields. In the present disclosure, the fault current limiting unit 320 may have a clearance length of 250 cm or less from the tank 302. Preferably, the clearance length may be 8-25 cm. Herein, the clearance length may refer to the shortest distance between the one or more superconducting circuits 322 and the tank 302.

Returning to FIG. 3A, the system 300 may also comprise one or more electrical bushings 316. The bushings 316 may comprise an inner conductive material (not shown) and an outer insulator. The distal end of the bushings 316 may be coupled to a respective current line 342 via terminals 344 and 346 to couple SCFCL system 300 to the transmission network (not shown). The current lines 342a may be the transmission line connecting the network equipment 102 to the reactor 104. The current line 342b may be connected to the transmission line on the distal end of the reactor 104, such that the system 300 is connected in parallel with reactor 104. The inner conductive material in the bushings 316 may connect the terminal 344 and 346 of the bushing 316 to the fault current limiting unit 320. Meanwhile, the outer insulator is used to insulate the enclosure or tank 302 from the inner conductive material, thereby allowing the tank 302 and the terminals 344 and 346 to be at different electrical potentials. The external shunt reactor 348 is preferably the existing reactor 104 currently in the power transmission network.

The temperature of one or more fault current limiting units 320 may be maintained at a desired temperature range by coolant 314 contained in the tank 302. In one embodiment, it may be desirable to maintain the fault current limiting units 320 at a low temperature, for example, ~77° K. To maintain at such a low temperature range, liquid nitrogen or helium gas may be used as coolant 314. In other embodiment, it may be desirable to maintain the temperature of the one or more fault current limiting units 320 at other temperature range, and other types of coolant, in gaseous or liquid form, may also be used. For example, it may be desirable to maintain the temperature of the fault current limiting units 320 at a room temperature. In such a case, air or water maintained at a room temperature may also be used as the coolant 314. When introduced, the coolants 314 may enter the tank 302 via a feed line (not shown) and a port 315 coupled to the tank 302. In the present disclosure, the feed line and the port 315 may preferably be made from thermally and/or electrically insulating material. However, the present disclosure does not preclude any one of the feed line and the port 315 from containing thermally and/or electrically conductive material. If the feed line and the port 315 do not provide grounding of the tank 302 or any component contained therein, they may be made from any type of material.

In the present embodiment, the tank 302 may be supported from the ground by an optional external support 334. Meanwhile, the fault current limiting units 320 may be supported from the tank 302 by an optional internal support 332. Those of ordinary skill in the art may recognize that both of the internal supports 332 and the external support 334 may be optional as the fault current limiting units 320 may be supported from the tank 302 by some other components. Even if included, the internal support 332 may support the fault current limiting units 320 from the side or top of the fault current limiting units 320, not necessarily from the bottom. Likewise, the tank 302 may be supported from the ground by some other components. Moreover, the external support 334, if included, may support the tank from the side or top of the tank 302, not necessarily from the bottom of the tank 302.

If included, each of the internal support 332 and the external support 334 may preferably be made from thermally and/or electrically insulating material. However, the present disclosure does not preclude thermally and/or electrically conductive internal support 332 and the external support 334. If thermally and/or electrically conductive external support 334 is used, it may be desirable to provide an electrically insulating material between the support 334 and the ground to electrically isolate the tank 302 from the ground.

The SCFCL system 300 may be incorporated into the current distribution network. The tank 302 may be electrically decoupled from the ground by air, which may act as an insulator, and optionally by the external support 334. As noted above, the tank 302 may be metallic tank 302 in some embodiments. In these embodiments, the tank 302 may typically float at a voltage that is close to the voltage of the terminals 344 and 346. It is contemplated that during normal operation, the voltage of the tank 302 may be approximately the same as the voltage being transmitted on the transmission lines 342 as the voltage at transmission lines 342a, 342b remain nearly identical. During fault, the voltage of the metal tank may be between the voltage at transmission lines 342a and 342b.

Figure 4:
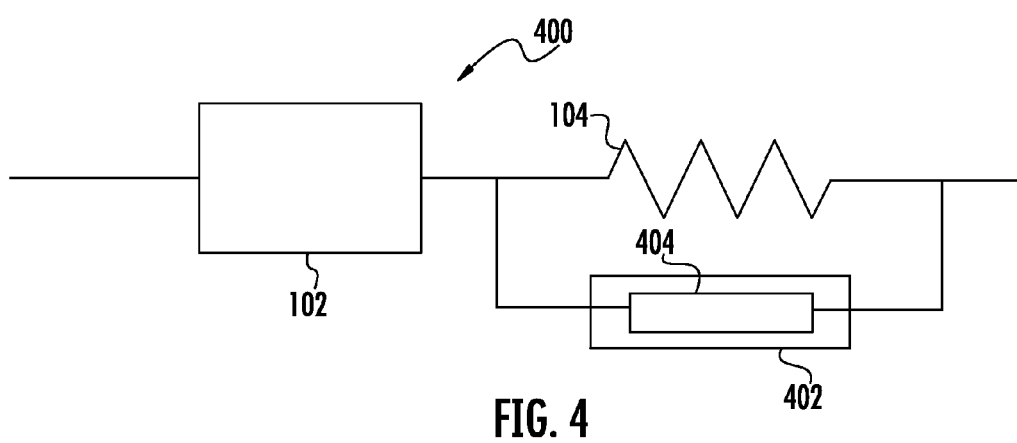
FIG. 4 is another embodiment of a fault current limiting system.

Referring to FIG. 4, there is shown a portion of a power transmission or distribution network 400 according to another embodiment of the present disclosure. As shown in the figure, the power transmission or distribution network 400 may comprise, among others, a network equipment 102. In the network 400, there may also be a current limiting reactor 104 serially connected to the network equipment 102. Further, there may be a current limiting switch connected to the current limiting reactor 104 in a parallel connection. In the present embodiment, the current limiting switch may be a circuit breaker 402.

The circuit breaker 402 may be a mechanical based circuit breaker comprising one or more switches that may mechanically open upon detection of the fault current. Alternatively, the circuit breaker 402 may be other types of fault current limiting system. Examples of other types of fault current limiting systems may include solid state fault current limiting systems or semiconductor based fault current limiting systems containing one or more semiconductor based circuits or devices 404. However, other types of circuit breaker 402 are not precluded in the present disclosure. In the case of a solid state fault current limiting system 402, various types of devices 404 may be included in the system 402. For example, a gate turn-off thyristor (GTO) may be used. GTOs have switching frequencies of roughly 1 kHz and can handle hundred or thousands of amps. In addition, multiple components may be placed in parallel if necessary to handle the current requirements. In addition to GTOs, other semiconductor devices, such as integrated gate commutated thyristors (IGCTs) and insulated gate bipolar transistors (IGBTs) may also be used. The inclusion of any circuit breaker 402 in parallel with the reactor 104 may lower the overall impedance. However, it may be preferable that the circuit breaker 402 has resistance or impedance less than the resistance or impedance of the reactor 104.

To manufacture the network 400 of the present embodiment, the circuit breaker 402 may be connected to the existing network 100 such that the circuit breaker 402 is in parallel connection to the reactor 104. By providing the circuit breaker 402 to the existing network 100, the components in the network such as, for example, the network equipment 102 need not be taken down, and the operation of the network equipment 102 need not be interrupted.

During normal operation, the circuit 404 within the circuit breaker 402 may be closed and the current may flow into or out of the network equipment 102. If the circuit 404 in the circuit breaker 402 is a superconducting or semiconductor circuit 404 and if the circuit 404 is connected to the reactor 104 in a parallel connection, the resistance or impedance of the reactor 104 and the circuit breaker 402, taken together, may be negligible when the circuit breaker 402 is closed. In effect, the current flowing into or out of the network equipment 102 may bypass the reactor 104. Even if a circuit other than the superconducting circuit is included in the circuit breaker 402, the resistance or impedance experienced by the current flowing into or out of the network equipment 102 will be less than the resistance or impedance without the circuit breaker 402 in parallel connection.

During the fault condition, the circuit breaker 402 may detect the fault current, and the circuit 404 may be opened. As described above, in some embodiments, the circuit 404 may open in less than ¼ period of the output power to guarantee that the maximum peak current is never delivered during the fault. In the case of 60 Hz operation, this means that the circuit 404 opens in less than 4 milliseconds. In the process, the fault current flowing into or out of the network equipment 102 may be limited by the reactor 104 and the circuit breaker 402. As such, the network equipment 102 may be protected. However, changes to power transmission characteristics, such as power loss, voltage loss and compensation, and phase angle change, may be minimized during normal operation.

Several embodiments of an apparatus for limiting fault current are disclosed. Those of the art will recognize that the present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of providing a power distribution network, the network comprising a network equipment and a current limiting reactor, the method comprising:
coupling a current limiting switch to the current limiting reactor in a parallel circuit while the reactor is operational, wherein the power distribution network is without the current limiting switch prior to the coupling and wherein the coupling of the current limiting switch to the current limiting reactor is performed without removing the current limiting reactor from the network, wherein the current limiting switch comprises a fault current limiter.

2. The method according to claim 1, wherein the fault current limiter comprises one of a superconducting fault current limiter and a semiconductor based fault current limiter.

3. The method of claim 1, wherein the fault current limiter is a solid state fault current limiter, and wherein the solid state fault current limiter comprises one or more components selected from the group consisting of gate turn-off thyristors, integrated gate commutated thyristors and insulated gate bipolar transistors.

4. The method of claim 1, wherein the power distribution network delivers power having a frequency and a period, and the current limiting switch detecting a fault within ¼ period of the output power.

5. The method of claim 1, wherein said method reduces power loss during normal operation.

6. The method of claim 1, wherein said method reduces voltage loss during normal operation.

7. The method of claim 1, wherein said method reduces phase angle change during normal operation.

8. A method of providing a power distribution network, the network comprising a network equipment and a current limiting reactor, the method comprising:
   coupling a current limiting switch to the current limiting reactor in a parallel circuit while the reactor is operational, wherein the power distribution network is without the current limiting switch prior to the coupling and wherein the coupling of the current limiting switch to the current limiting reactor is performed without removing the current limiting reactor from the network, wherein the current limiting switch comprises a circuit breaker, wherein the circuit breaker contains a superconducting circuit.

9. The method according to claim 8, wherein the circuit breaker contains a semiconductor based circuit.

10. A method of providing a power distribution network, the network comprising a network equipment and a current limiting reactor, the method comprising:
   coupling a current limiting switch to the current limiting reactor in a parallel circuit while the reactor is operational, wherein the power distribution network is without the current limiting switch prior to the coupling and wherein the coupling of the current limiting switch to the current limiting reactor is performed without removing the current limiting reactor from the network, wherein the fault current limiter is a solid state fault current limiter, and wherein the solid state fault current limiter comprises one or more components selected from the group consisting of gate turn-off thyristors, integrated gate commutated thyristors and insulated gate bipolar transistors.

* * * * *